(12) United States Patent  
Cho

(10) Patent No.: US 7,593,285 B2  
(45) Date of Patent: Sep. 22, 2009

(54) SEMICONDUCTOR MEMORY DEVICE WITH DELAY LOCKED LOOP

(75) Inventor: Yong-Deok Cho, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 151 days.

(21) Appl. No.: 11/647,267

(22) Filed: Dec. 29, 2006

(65) Prior Publication Data

US 2008/0056030 A1   Mar. 6, 2008

(30) Foreign Application Priority Data

Aug. 31, 2006   (KR) ...................... 10-2006-0083741

(51) Int. Cl.  
*G11C 8/00* (2006.01)

(52) U.S. Cl. .............................. 365/233.1; 365/233.11; 365/233.12; 365/194

(58) Field of Classification Search .............. 365/233.1, 365/233.11, 233.12, 194  
See application file for complete search history.

(56) References Cited

U.S. PATENT DOCUMENTS

| | | | |
|---|---|---|---|
| 6,573,771 | B2 | 6/2003 | Lee et al. |
| 6,650,594 | B1* | 11/2003 | Lee et al. ............... 365/233.15 |
| 2003/0122599 | A1* | 7/2003 | Kim ........................ 327/161 |
| 2005/0141334 | A1* | 6/2005 | Jeong ....................... 365/233 |
| 2006/0188051 | A1* | 8/2006 | Donnelly et al. ............ 375/371 |
| 2006/0220714 | A1* | 10/2006 | Hur ........................... 327/175 |
| 2006/0290397 | A1* | 12/2006 | Kim ........................... 327/158 |
| 2007/0194821 | A1* | 8/2007 | Gomm et al. ............... 327/158 |

FOREIGN PATENT DOCUMENTS

| | | |
|---|---|---|
| JP | 2004-220602 | 8/2004 |
| JP | 2005-316722 | 11/2005 |
| JP | 2006-060842 | 3/2006 |
| KR | 1999-0038915 | 6/1999 |
| KR | 10-2006-0104895 A | 10/2006 |

OTHER PUBLICATIONS

Korean Office Action issued in Korean Patent Application No. KR 10-2006-0083741, dated on Jan. 28, 2008.

* cited by examiner

*Primary Examiner*—Thong Q Le  
(74) *Attorney, Agent, or Firm*—Mannava & Kang, P.C.

(57) ABSTRACT

It is provided a semiconductor device with the ability to carry out data output operation using a reference clock of which the duty cycle is substantially 50%. The semiconductor device includes a clock buffer for receiving the external clock to generate an internal clock; a delay locked loop circuit for receiving the internal clock to generate a delay locked clock, a controlling unit for generating a control signal, a data output unit for output of data synchronized with a reference clock, and a clock transfer circuit for receiving the delay locked clock to output the reference clock in response to the control signal wherein the clock transfer circuit corrects the duty cycle of the delay locked clock based on a duty cycle information of the reference clock.

18 Claims, 3 Drawing Sheets

SEMICONDUCTOR MEMORY DEVICE WITH DELAY LOCKED LOOP

CROSS-REFERENCE TO RELATED APPLICATIONS

The present invention claims priority of Korean patent application number 10-2006-0083741, filed on Aug. 31, 2006, which is incorporated by reference in its entirety.

BACKGROUND OF THE INVENTION

The present invention relates to a semiconductor device, and more particular, to a semiconductor memory device with a delay locked loop circuit.

A semiconductor memory device embodied in a system which includes a plurality of semiconductor devices is used for storing data. The semiconductor memory device outputs data stored in cells corresponding to an address outputted from a data requesting unit such as a central processing unit or stores data provided from the data requesting unit into the cells.

As the operational speed of systems including a plurality of semiconductor devices has increased and technology related with a semiconductor integrated circuitry has advanced, there has been a demand for increased data access speed from semiconductor memory devices. In order to access data from a semiconductor memory device at high speed, a synchronous memory device which receives a clock and can access data of each cycle of a received clock has been proposed. Nevertheless, such a synchronous memory device does not meet the data access speeds demanded by modern systems, particularly the data requesting unit included in the system. In response, a double data rate (DDR) synchronous semiconductor memory device has been proposed which can access data on both the rising and falling edges of a clock.

The DDR synchronous semiconductor memory device should receive or output two items of data within one cycle of a clock, since the DDR synchronous semiconductor memory device accesses one item of data for every transition of the clock. That is, the DDR synchronous semiconductor memory device should output or receive data exactly synchronized with the rising edge and falling edge of the clock. Typically, the output circuit of the DDR synchronous semiconductor memory device receives the system clock through a clock transfer path including a clock buffer, clock transmission lines, and the like inside the DDR synchronous semiconductor memory device and outputs data synchronized with the received clock.

However, the clock reaches the output circuit of the DDR synchronous semiconductor memory device with an essential delay which occurs while passing through the clock input buffer and the clock signal transmission lines in the DDR synchronous semiconductor memory device. Although the output circuit outputs data in synchronization with the internally received clock, data is delayed by the essential delay, and are provided from the DDR synchronous semiconductor memory device out of phase with the received clock used by an external device receiving the data.

To solve the problem described above, the DDR synchronous semiconductor memory device includes a circuit, i.e., a delay locked loop circuit, for adjusting the essential delay by locking a delay of the transferred clock. The delay locked loop compensates for a delay introduced by the clock transfer path of the semiconductor memory device. The delay locked loop circuit detects a delay which occurs while an input clock passes through the clock transfer path including the clock input circuit, the clock signal transmission lines, and the like, and delays the input clock for a delay time corresponding to the detected delay value to thereby provide a delay locked clock to the output circuit. That is, the delay locked loop circuit intentionally delays and locks the input clock by a constant delay value depending on an amount of detected delay to provide the delay locked clock to the output circuit. Then, the output circuit outputs data synchronized with the delay locked clock. Then the data output from the output circuit is transferred to the external devicein synchronicity with the input clock.

However, as the frequency of the input clock increases more and more, the operating margin for accessing data becomes much shorter. At higher frequencies, it is more important to assure that the delay locked clock has a 50% duty cycle. If the duty cycle of the delay locked clock is not 50%, the data processing margin of either the rising edge or the falling edge of the delay locked clock becomes too short for proper operation. Therefore, recent DDR synchronous semiconductor memory devices have a duty cycle correction circuit for correcting the duty cycle of a delay locked clock generated by a delay locked loop circuit.

FIG. 1 shows a block diagram of a conventional semiconductor memory device. The conventional semiconductor memory device includes a clock buffer 10, a delay locked loop circuit 20, a duty correction unit 30, a clock transfer unit 40, a data output unit 50 and a controlling unit 60.

The clock buffer 10 receives clocks ECLK and ECLKB to output to an internal clock ICLK0. The delay locked loop circuit 20 receives the internal clock ICLK0 to generate a delay locked clock ICLK1. The delay locked clock ICLK1 is a reference clock for the output of data synchronized with the clocks ECLK and ECLKB. The duty correction unit 30 corrects the duty cycle of the delay locked clock ICLK1 to generate an internal clock ICLK2. The clock transfer unit 40 receives the internal clock ICLK2 to generate internal clocks ICLK3 and ICLK3B in response to a control signal CN. The data output unit outputs data D[0:N-1] provided from a memory core area in response to the internal clocks ICLK3 and ICLK3B. The controlling unit 60 generates the control signal CN which is used for controlling an operation of the clock transfer unit 40. The control signal CN has information corresponding to a read latency and a burst length determined by an operation mode of the conventional semiconductor memory device. The read latency specifies a period between the input timing of the read command and the output timing of corresponding data. The burst length means the number of output data items corresponding to a command.

FIG. 2 shows a waveform diagram representing operation of the conventional semiconductor memory device shown in FIG. 1. The conventional semiconductor memory device receives the clocks ECLK and ECLKB to generate the internal clocks ICLK3 and ICLK3B as reference clocks for the data output unit 50 to output data. Consequently, the data output unit outputs data synchronized with the internal clocks ICLK3 and ICLK3B.

When the duty cycle of the internal clocks ICLK3 and ICLK3B is 50%, the data output unit 50 has the maximum margin to output data on every transition of the internal clocks ICLK3 and ICLK3B. If the duty cycle of the internal clocks ICLK3 and ICLK3B is not 50%, the data processing margin for either the rising edge or the falling edge of the internal clocks ICLK3 and ICLK3B is reduced.

Although the duty correction unit 30 corrects the internal clock ICLK1 to generate the internal clock ICLK2 with a duty cycle of 50%, the duty cycle of the internal clocks ICLK3 and ICLK3B can become different. Then, the data output unit 50 can not carry out data output operations for a predetermined equal time on every transition of the internal clocks ICLK3 and ICLK3B.

In the situation that the frequency of the clock input to the semiconductor memory device becomes higher and higher, if the data output unit 50 attempts data output operations using reference clocks of which the duty cycle is not substantially 50%, the data output unit may not have a sufficient data processing margin for output of data. The data output unit may not even be able output data an each predetermined transition time of a clock.

SUMMARY OF THE INVENTION

Embodiments of the present invention are directed to provide a semiconductor device with the ability to carry out data output operation using an internal reference clock of which the duty cycle is substantially 50%.

In accordance with an aspect of the present invention, there is provided a semiconductor device that includes a clock buffer to receive an external clock to generate an internal clock; a delay locked loop circuit for receiving the internal clock to generate a delay locked clock, a controlling unit for generating a control signal, a data output unit to output data synchronized with a reference clock, and a clock transfer circuit for receiving the delay locked clock to output the reference clock in response to the control signal wherein the clock transfer circuit corrects a duty cycle of the delay locked clock based on duty cycle information of the reference clock.

In accordance with another aspect of the present invention, there is provided a semiconductor memory device that includes a delay locked loop circuit for receiving an external clock to generate a delay locked clock, a clock signal transfer unit for generating a reference clock using a feed-back signal and the delay locked clock, a data output unit to output data synchronized with the reference clock, and a duty correction unit to generate the feed-back signal for correcting the duty cycle of the reference clock.

In accordance with a further aspect of the present invention, there is provided a method for operating a semiconductor memory device, which includes generating a delay locked clock, generating a reference clock using the delay locked clock in response to a control signal, generating a feed-back signal for correcting a duty cycle of the reference clock, correcting the duty cycle of the reference clock in response to the feed-back signal, and outputting data synchronized with the reference clock.

DESCRIPTION OF SPECIFIC EMBODIMENTS

Figure 1:
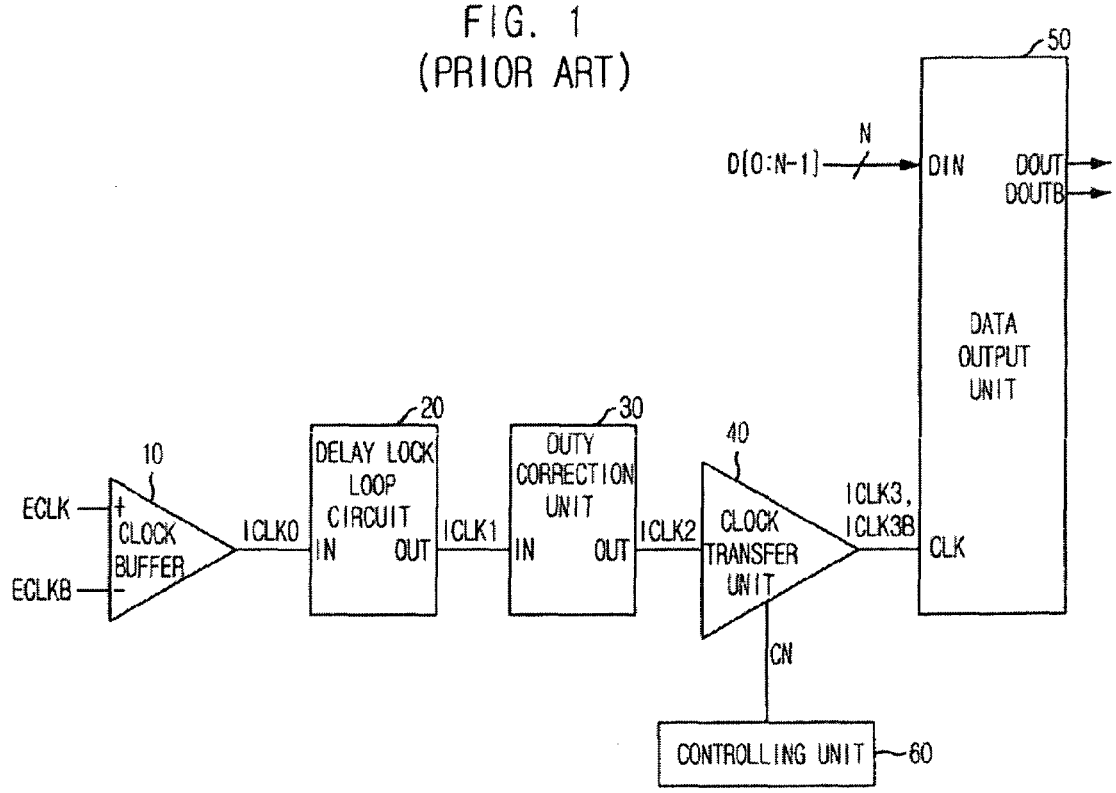
FIG. 1 shows a block diagram of a conventional semiconductor memory device.
Figure 2:
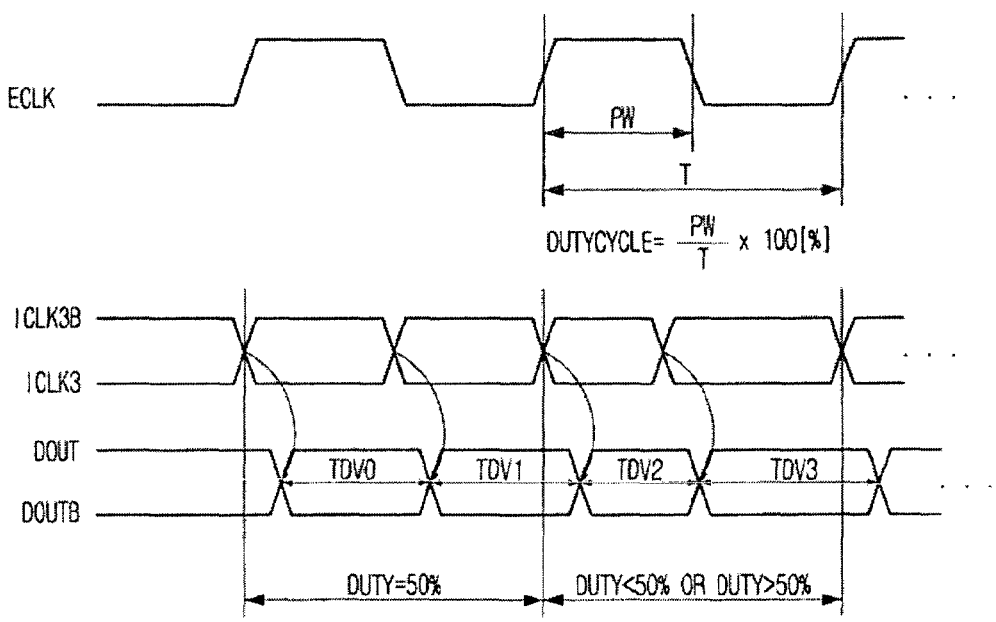
FIG. 2 shows a waveform diagram representing operation of the convention semiconductor memory device in FIG. 1.
Figure 3:
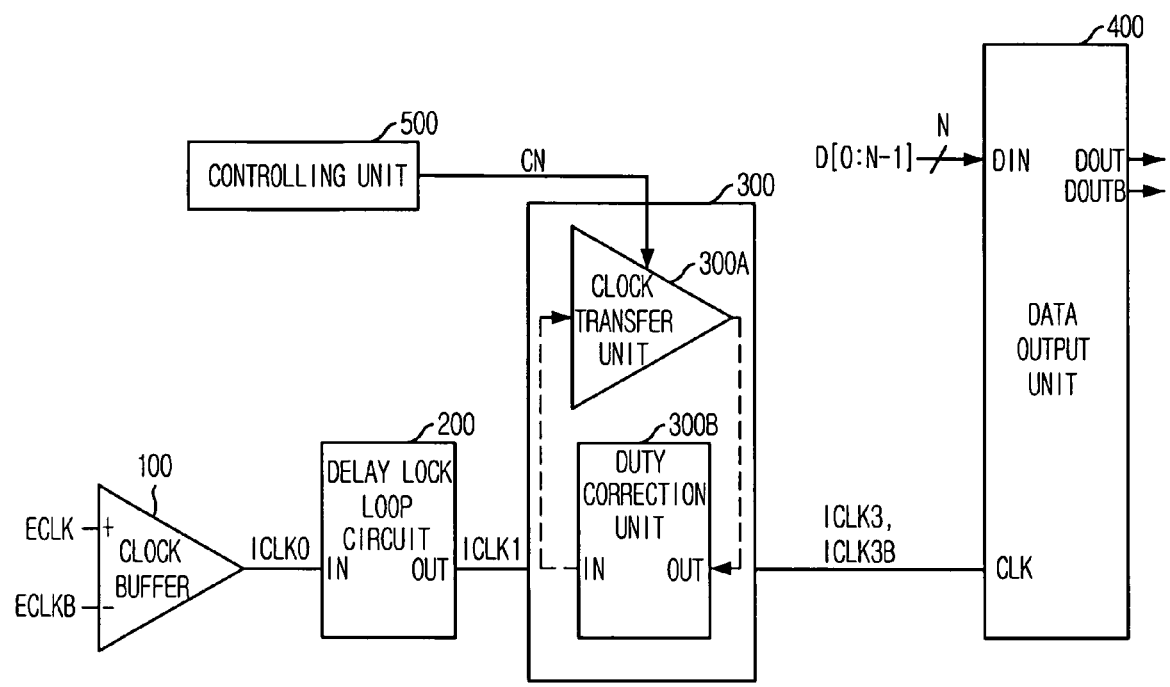
FIG. 3 shows a block diagram of an exemplary embodiment of a semiconductor memory device in accordance to the present invention.

FIG. 3 shows a block diagram of an exemplary embodiment of a semiconductor memory device in accordance to the present invention. The semiconductor memory device includes a clock buffer 100, a delay locked loop circuit 200, a clock transfer circuit 300, a data output circuit 400, and a controlling unit 500.

The clock buffer 100 receives the external clocks ECLK and ECLKB to generate an internal clock ICLK0. The delay locked loop circuit 200 receives the internal clock ICLK0 to generate a delay locked clock ICLK1. The clock transfer circuit 300 receives the delay locked clock ICLK1 to output the reference clocks ICLK3 and ICLK3B in response to the control signal CN wherein the clock transfer circuit 300 corrects the duty cycle of the delay locked clock ICLK1 using information regarding the duty cycle of the reference clocks ICLK3 and ICLK3B. The clock transfer circuit 300 includes a clock signal transfer unit 300A and a duty correction unit 300B. The data output unit 400 receives data D[0:N-1] from a core area (not shown) and outputs data DOUT and DOUTB synchronized with the reference clocks ICLK3 and ICLK3B using the received data D[0:N-1]. The controlling unit 500 generates the control signal CN. The control signal CN has information corresponding to a read latency and a burst length. The main characteristics of the semiconductor memory device according to the present invention is summarized in that the output clocks, i.e., the reference clocks ICLK3 and ICLK3B of the clock transfer circuit 300 have 50% duty cycle and are transferred to the data output unit 400. Because the duty cycle of the reference clocks ICLK3 and ICLK3B is substantially 50%, the data output unit 400 can have a maximum margin to output data on every transition of the reference clocks ICLK3 and ICLK3B.

Figure 4:
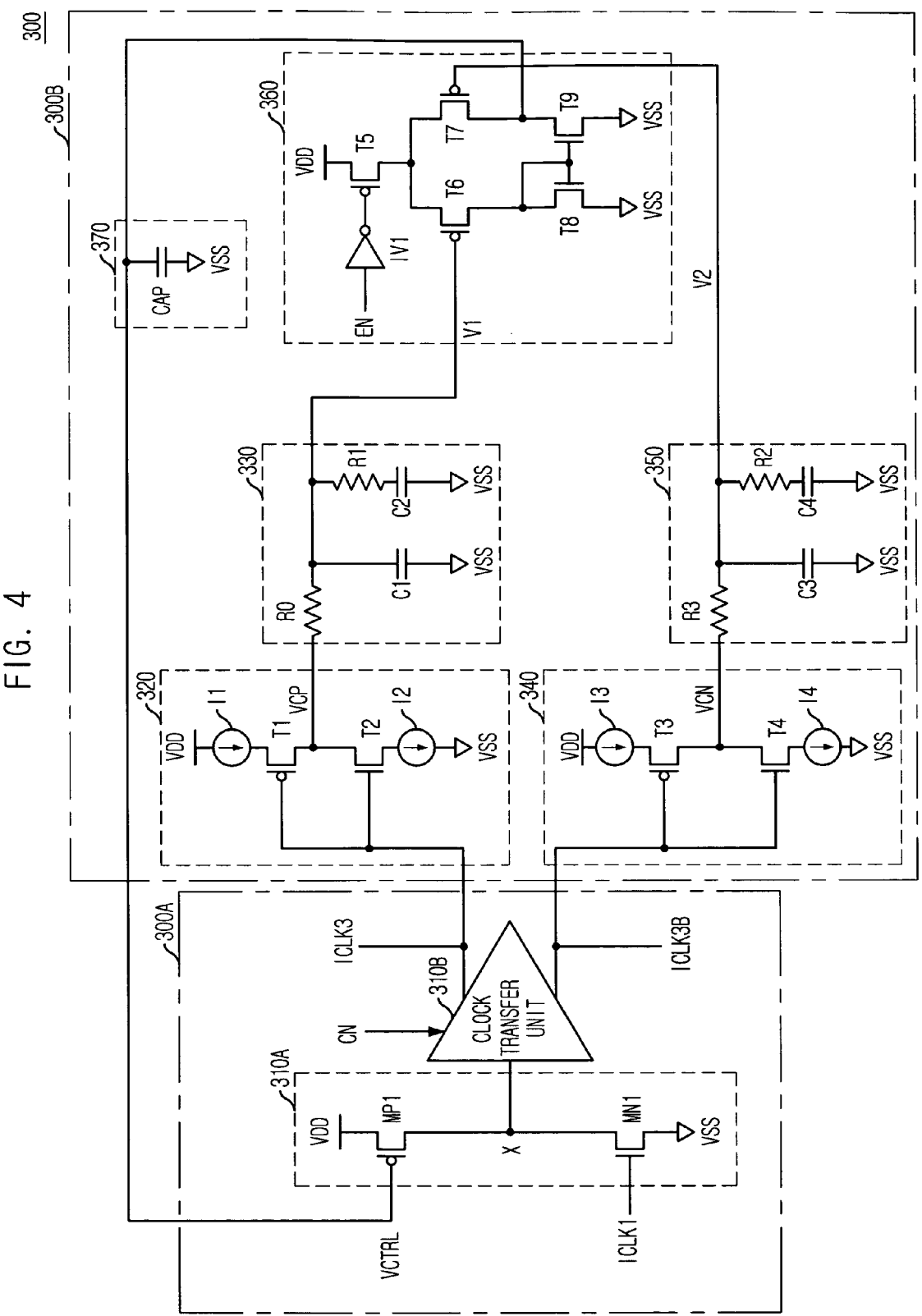
FIG. 4 shows an exemplary schematic diagram of the clock transfer circuit in FIG. 3.

FIG. 4 shows an exemplary schematic diagram of the clock transfer circuit in FIG. 3. The clock transfer circuit 300 has the clock signal transfer unit 300A including a first clock signal transfer unit 310A and a second clock signal transfer unit 310B and the duty correction unit 300B.

The first clock signal transfer unit 300A transfers the delay locked clock ICLK1 in response to a feed-back signal VCTRL to generate the reference clocks ICLK3 and ICLK3B. The first clock signal transfer unit 300A includes a MOS transistor MP1 for pulling up a transfer node X in response to the feed-back signal VCTRL and a MOS transistor MN1 for pulling down the transfer node X in response to the delay locked clock ICLK1. The feed-back signal VCTRL has information for correcting the duty cycle of the reference clocks ICLK3 and ICLK3B. In order to do that, the feed-back signal VCTRL has a voltage level corresponding to the information for correcting duty cycle of the reference clocks ICLK3 and ICLK3B. The MOS transistor MN1 are turned on when the delay locked clock ICLK1 has a logic high level and then, the transfer node X is attempted to pull down. Alternatively, the MOS transistor MP1 is turned on when the feed-back signal VCTRL has a logic low level and then, the transfer node X is attempted to pull up. The logic level of the transfer node X is determined by the turn-on periods of the MOS transistor MP1 and the MOS transistor MN1. Thus, the duty cycle of the delay locked clock ICLK1 transferred into the second clock transfer unit 310B is adjusted by the feed-back signal VCTRL. The second clock signal transfer unit 310B generates the reference signals ICLK3 and ICLK3B in response to the control signal CN using the transferred delay locked clock.

The duty correction unit 300B generates the feed-back signal VCTRL for correcting the duty cycle of the reference clocks ICLK3 and ICLK3B. The duty correction unit 300B includes a first charge pumping unit 320, a first loop filtering unit 330, a second charge pumping unit 340, a second loop filtering unit 350, a voltage comparing unit 360, and a by-pass unit 370. The first charge pumping unit 320 pumps an amount of first positive or negative charge based on the logic level of the reference clock ICLK3. The first loop filtering unit 330 generates a first comparing voltage V1 corresponding to the amount of the first positive or negative charge. The second charge pumping unit 340 pumps an amount of second positive or negative charge based on a logic level of the reference clock ICLK3B. The second loop filtering unit 350 generates a second comparing voltage V2 corresponding to the second positive or negative charge. The voltage comparing unit 360 compares the first comparing voltage V1 with the second comparing voltage V2 to generate the feed-back voltage VCTRL. The by-pass unit 370 filters the peak parts of the feed-back signal VCTRL between the voltage comparing unit 360 and the first clock signal transfer unit 310A. The by-pass unit 370 includes a capacitor CAP between an output node of the feed-back voltage VCTRL and a ground voltage VSS.

The first charge pumping unit 320 includes a first current sourcing unit I1, a MOS transistor T1, a MOS transistor T2, and a second current sourcing unit I2. The first current sourcing unit I1 supplies a first current. The MOS transistor T1 has a gate connected to the reference clock ICLK3, one terminal to receive the first current, and the other terminal to supply the first current into a charge node VCP. The MOS transistor T2 has a gate connected to the reference clock ICLK3, one terminal to receive current from the charge node VCP, and the other terminal to transfer the second current, and a second current sourcing unit I2 for discharging the second current into a ground voltage VSS. The first loop filtering unit 330 includes a resistor R0 coupled to the charge node VCP, a first capacitor C1 coupled between the resistor R0 and the ground voltage VSS, a resistor R1 coupled to the resistor R0, and a second capacitor C2 coupled between the resistor R1 and the ground voltage VSS. The second charge pumping unit 340 has the same configuration as the first charge pumping unit 320, but is connected to reference clock ICLK3B, rather than ICK3. Also, the second loop filtering unit 350 has the same configuration as the first loop filtering unit 330.

The voltage comparing unit 360 includes a PMOS transistor T5 having a gate connected to an enable signal EN through an inverter IV1 and a first terminal connected to a power supply voltage, a PMOS transistor T6 having a gate connected to the first comparing voltage V1 and a first terminal connected to the second terminal of the PMOS transistor T5, a PMOS transistor T7 having a gate connected to the second comparing voltage V2 and a first terminal connected to the second terminal of the PMOS transistor T5, a NMOS transistor T8 having a gate and a first terminal connected to the second terminal of the PMOS transistor T6 and the second terminal connected to the ground voltage VSS and a NMOS transistor T9 having a gate connected to the gate of the first NMOS transistor T8, a first terminal connected to the other terminal of the PMOS transistor T7, and the second terminal connected to the ground voltage VSS.

If the duty cycle of the reference clocks ICLK3 and ICLK3B is not 50%, the first pumping unit 320 pumps an amount of first positive or negative charge based on a logic level of the reference clock ICLK3 and the second pumping unit 330 pumps an amount of second positive or negative charge based on a logic level of the reference clock ICLK3B. The first loop filtering unit 330 generates the first comparing voltage V1 corresponding to the first positive or negative charge and the second loop filtering unit 350 generates the second comparing voltage V2 corresponding to the second positive or negative charge. The voltage comparing unit 360 compares the first comparing voltage V1 with the second comparing voltage V2 to generate the feed-back voltage VCTRL corresponding to the compared result. The first clock signal transfer unit 310A pulls up or pulls down the transfer node X corresponding to the delay locked clock ICLK1 and the feed-back signal VCTRL. As a result, the second clock signal transfer unit 310B receives a duty corrected clock signal and can output the reference clocks ICLK3 and ICLK3B with a 50% duty cycle.

If the duty cycle of the reference clocks ICLK3 and ICLK3B becomes 50%, the first pumping unit 320 and the second pumping unit 330 will not pump an amount of first positive or negative charge into the charge nodes VCP and VCN. Then, the first loop filtering unit 330 and the second loop filtering unit 350 regularly maintains the levels of the first comparing voltage V1 and the second comparing voltage V2. Thus, if the duty cycle of the reference clocks ICLK3 and ICLK3B becomes 50%, additional current consumption will not occur for duty cycle correction of the reference clocks ICLK3 and ICLK3B.

Finally, the data output circuit of the semiconductor memory device according to the prevent invention can carry out a data output operation synchronized with a reference clock of which the duty cycle is substantially 50%. Hence, the semiconductor memory device according to the prevent invention has the maximum margin to output on data every transition of a clock. Although the frequency of a clock input to a semiconductor memory device is higher, because the data output operation of the semiconductor memory device has a maximum margin, manufacturers can more easily design and develop a semiconductor memory device with high reliability for the data output timing.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a clock buffer configured to receive an external clock to generate an internal clock;
   a delay locked loop circuit configured to receive the internal clock to generate a delay locked clock;
   a controlling unit configured to generate a control signal;
   a data output unit configured to output data synchronized with reference clocks; and
   a clock transfer circuit configured to receive the delay locked clock and to output the reference clocks in response to the control signal wherein the clock transfer circuit corrects the duty cycle of the delay locked clock by using a feed-back signal of the reference clocks having duty cycle information of the reference clocks to output duty-cycle controlled reference clocks as the reference clocks,
   wherein the control signal has information corresponding to a read latency and a burst length.

2. The semiconductor memory device of claim 1, wherein the clock transfer circuit includes:
   a first clock signal transfer unit configured to receive the feed-back signal of the reference clocks and to transfer the delay locked clock in response to the feed-back signal of the reference clocks;
   a second clock signal transfer unit configured to transfer the transferred delay locked clock to generate the reference clocks in response to the control signal; and
   a duty correction unit configured to generate the feed-back signal of the reference clocks having information for correcting the duty cycle of the reference clocks.

3. The semiconductor memory device of claim 2, wherein the first clock signal transfer unit includes:

a first MOS transistor for pulling up a transfer node in response to the feed-back signal wherein a clock signal of the transfer node is transferred to the second clock signal transfer unit; and a second MOS transistor for pulling down the transfer node in response to the delay locked clock.

4. The semiconductor memory device of claim 3, wherein the duty correction unit includes:

a first charge pumping unit for pumping an amount of first positive or negative charge based on a first logic level of one of the reference clocks;

a second charge pumping unit for pumping an amount of second positive or negative charge based on a second logic level of the other of the reference clocks;

a first loop filtering unit for generating a first comparing voltage corresponding to the first positive or negative charge;

a second loop filtering unit for generating a second comparing voltage corresponding to the second positive or negative charge; and a voltage comparing unit for comparing the first comparing voltage with the second comparing voltage to generate the feed-back voltage.

5. The semiconductor memory device of claim 4, wherein the first charge pumping unit includes:

a first current sourcing unit for supplying a first current;

a third MOS transistor having a gate connected to the first logic level of the reference clock, a first terminal to receive the first current and the second terminal to supply the first current into a charge node wherein a voltage of the charge node is the first comparing voltage;

a fourth MOS transistor having a gate connected to the first logic level of the reference clock, a first terminal to receive a second current from the charge node, and the second terminal to transfer the second current; and a second current sourcing unit for discharging the second current into a ground voltage.

6. The semiconductor memory device of claim 5 wherein the first loop filtering unit includes:

a first capacitor coupled between the charge node and the ground voltage;

a resistor coupled to the charge node; and a second capacitor coupled between the resistor and the ground voltage.

7. The semiconductor memory device of claim 4, wherein the voltage comparing unit includes:

a first PMOS transistor having a gate connected to an enable signal and a first terminal connected to a power supply voltage;

a second PMOS transistor having a gate connected to the first comparing voltage and a first terminal connected to the second terminal of the first PMOS transistor;

a third PMOS transistor having a gate connected to the second comparing voltage and a first terminal connected to the second terminal of the first PMOS transistor;

a first NMOS transistor having a gate and a first terminal connected to the second terminal of the second PMOS transistor and the second terminal connected to the ground voltage; and a second NMOS transistor having a gate connected to the gate of the first NMOS transistor, a first terminal connected to the second terminal of the third PMOS transistor and the second terminal connected to the ground voltage.

8. The semiconductor memory device of claim 4, wherein the duty correction unit further comprises a by-pass unit for filtering the peak part of the feed-back signal and arranged between the voltage comparing unit and the first clock signal transfer unit.

9. A semiconductor memory device, comprising:

a delay locked loop circuit configured to receive an external clock to generate a delay locked clock;

a clock signal transfer unit configured to receive a feed-back signal of reference clocks and to generate duty-cycle controlled reference clocks as the reference clocks based on the feed-back signal of the reference clocks and the delay locked clock;

a data output unit configured to output data synchronized with the reference clocks; and a duty correction unit configured to generate the feed-back signal of the reference clocks having information for correcting the duty cycle of the reference clocks and to output the feed-back signal to the clock signal transfer unit, wherein the control signal has information corresponding to a read latency and a burst length.

10. The semiconductor device of claim 9, wherein the clock signal transfer unit includes:

a first clock signal transfer unit for transferring the delay locked clock in response to the feed-back signal; and a second clock signal transfer unit for transferring the transferred delay locked clock to generate the reference clocks in response to a control signal.

11. The semiconductor memory device of claim 10, wherein the first clock signal transfer unit includes:

a first MOS transistor for pulling up a transfer node in response to the feed-back signal wherein a clock signal of the transfer node is transferred to the second clock signal transfer unit; and a second MOS transistor for pulling down the transfer node in response to the delay locked clock.

12. The semiconductor memory device of claim 9, wherein the duty correction unit includes:

a first charge pumping unit for pumping an amount of first positive or negative charge based on a first logic level of one of the reference clocks;

a second charge pumping unit for pumping an amount of second positive or negative charge based on a second logic level of the other of the reference clocks;

a first loop filtering unit for generating a first comparing voltage corresponding to the first positive or negative charge;

a second loop filtering unit for generating a second comparing voltage corresponding to the second positive or negative charge; and a voltage comparing unit for comparing the first comparing voltage with the second comparing voltage to generate the feed-back voltage.

13. The semiconductor memory device of claim 12, wherein the first charge pumping unit includes:

a first current sourcing unit for supplying a first current;

a third MOS transistor having a gate connected to the first logic level of the reference clocks, a first terminal to receive the first current and the second terminal to supply the first current into a charge node wherein a voltage of the charge node is the first comparing voltage;

a fourth MOS transistor having a gate connected to the first logic level of the reference clocks, a first terminal to receive a second current from the charge node and the second terminal to transfer the second current; and a second current sourcing unit for discharging the second current into a ground voltage.

14. The semiconductor memory device of claim 13, wherein the first loop filtering unit includes:
   a first capacitor coupled between the charge node and the ground voltage;
   a resistor coupled to the charge node; and
   a second capacitor coupled between the resistor and the ground voltage.

15. The semiconductor memory device of claim 14, wherein the voltage comparing unit includes:
   a first PMOS transistor having a gate connected to an enable signal and a first terminal connected to a power supply voltage;
   a second PMOS transistor having a gate connected to the first comparing voltage and a first terminal connected to the second terminal of the first PMOS transistor;
   a third PMOS transistor having a gate connected to the second comparing voltage and a first terminal connected to the second terminal of the first PMOS transistor;
   a first NMOS transistor having a gate and a first terminal connected to the second terminal of the second PMOS transistor and the second terminal connected to the ground voltage; and
   a second NMOS transistor having a gate connected to the first terminal of the first NMOS transistor, a first terminal connected to the second terminal of the third PMOS transistor and the second terminal connected to the ground voltage.

16. The semiconductor memory device of claim 12, wherein the duty correction unit further comprises a by-pass unit for filtering the peak part of the feed-back signal between the voltage comparing unit and the first clock signal transfer unit.

17. A method for operating a semiconductor memory device, comprising:
   generating a delay locked clock;
   generating reference clocks using the delay locked clock in response to a control signal;
   generating a feed-back signal of the reference clocks for correcting the duty cycle of the reference clocks;
   correcting the duty cycle of the reference clocks in response to the feed-back signal of the reference clocks; and
   outputting data synchronized with the reference clocks,
   wherein the control signal has information corresponding to a read latency and a burst length, and
   wherein the feed-back signal of the reference clocks has duty cycle information of the reference clocks.

18. The method for operating the semiconductor memory device of claim 17, wherein generating the feed-back signal includes:
   pumping an amount of first positive or negative charge based on a first logic level of the reference clocks;
   pumping an amount of second positive or negative charge based on a second logic level of the reference clocks;
   generating a first comparing voltage corresponding to the first positive or negative charge;
   generating a second comparing voltage corresponding to the second positive or negative charge; and
   comparing the first comparing voltage with the second comparing voltage to generate the feed-back voltage.

* * * * *